United States Patent
Bohannon et al.

(10) Patent No.: US 9,817,502 B2
(45) Date of Patent: Nov. 14, 2017

(54) SWITCHED-CAPACITOR HARMONIC-REJECT MIXER

(71) Applicant: Synaptics Incorporated, San Jose, CA (US)

(72) Inventors: Eric Scott Bohannon, Henrietta, NY (US); Steve Chikin Lo, Sunnyvale, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 14/584,942

(22) Filed: Dec. 29, 2014

(65) Prior Publication Data

US 2016/0190987 A1 Jun. 30, 2016

(51) Int. Cl.
*G06F 3/041* (2006.01)
*G06F 3/044* (2006.01)
*H03D 7/14* (2006.01)

(52) U.S. Cl.
CPC ............ *G06F 3/0412* (2013.01); *G06F 3/044* (2013.01); *G06F 3/0416* (2013.01); *H03D 7/1466* (2013.01); *H03D 2200/0078* (2013.01); *H03D 2200/0086* (2013.01)

(58) Field of Classification Search
None
See application file for complete search history.

(56) References Cited

U.S. PATENT DOCUMENTS

| 5,880,411 | A | * | 3/1999 | Gillespie | G06F 3/03547 178/18.01 |
|---|---|---|---|---|---|
| 8,138,817 | B2 | | 3/2012 | Brekelmans et al. | |
| 8,374,569 | B2 | | 2/2013 | Seendripu et al. | |
| 8,461,901 | B1 | | 6/2013 | Morton et al. | |
| 8,498,605 | B1 | * | 7/2013 | Cook | H03D 7/1441 455/325 |
| 2006/0160518 | A1 | | 7/2006 | Seendripu et al. | |
| 2008/0284487 | A1 | * | 11/2008 | Pullela | H03D 7/1441 327/355 |
| 2009/0251350 | A1 | * | 10/2009 | Park | H03D 7/14 341/172 |
| 2010/0151900 | A1 | * | 6/2010 | Koli | G11C 27/024 455/550.1 |
| 2011/0279164 | A1 | * | 11/2011 | Shimizu | H03D 7/1441 327/355 |

(Continued)

*Primary Examiner* — Nicholas Lee
*Assistant Examiner* — Benjamin Casarez
(74) *Attorney, Agent, or Firm* — Patterson + Sheridan, LLP

(57) ABSTRACT

A discrete-time harmonic rejection mixer, an input device, and methods for using the same are described herein. In one example, a discrete-time harmonic rejection mixer includes a switched-capacitor network and a switch controller. The switched-capacitor network includes first, second, and third switched capacitor sub-circuits, each including a pair of capacitors and a set of switches. The switch controller is coupled to the switched-capacitor network, and is configured to operate the sets of switches. More specifically, the switch controller is configured to operate the sets of switches in an out of phase manner to produce the harmonic rejection effect. Capacitance values for the first pair of capacitors are roughly equal to capacitance values for the third pair of capacitors. An input device, method, and harmonic rejection circuit exhibiting the above features are provided as examples.

20 Claims, 9 Drawing Sheets

(56) References Cited

U.S. PATENT DOCUMENTS

| | | | |
|---|---|---|---|
| 2011/0310051 A1* | 12/2011 | Souchkov | G06F 3/0416 345/174 |
| 2011/0310054 A1* | 12/2011 | Souchkov | G06F 3/044 345/174 |
| 2012/0049869 A1* | 3/2012 | Kremin | G06F 3/0412 324/679 |
| 2012/0063555 A1* | 3/2012 | Pullela | H04B 1/1638 375/350 |
| 2012/0068966 A1* | 3/2012 | Washburn | G06F 3/044 345/174 |
| 2014/0267129 A1* | 9/2014 | Rebeschi | H03K 17/9622 345/174 |
| 2015/0016492 A1* | 1/2015 | Koli | H03H 19/008 375/219 |
| 2016/0380593 A1* | 12/2016 | Lu | H03D 7/1441 327/361 |

* cited by examiner

SWITCHED-CAPACITOR HARMONIC-REJECT MIXER

BACKGROUND

Field of the Disclosure

Embodiments generally relate to input sensing and, in particular, to a switched-capacitor harmonic-reject mixer.

Description of the Related Art

Circuits for processing sampled signals (as opposed to continuous signals) are common in many types of electronic systems. Such circuits may be susceptible to interference from noise signals at harmonic frequencies of a particular subject frequency. In one example, capacitive touch sensor devices may include circuitry for driving sensor electrodes with a sensing signal and measuring effects related to input objects in a sensing region. Such capacitive touch sensor devices may be susceptible to noise signals having frequencies at or near harmonic frequencies of the sensing signal. Thus, a technique for rejecting harmonic frequencies for sampled signals is needed in the art.

SUMMARY

One example disclosed herein includes a discrete-time harmonic rejection mixer. The discrete-time harmonic rejection mixer includes a switched-capacitor network and a switch controller. The switched-capacitor network includes a first switched capacitor sub-circuit including a first pair of capacitors and a first set of switches. The switched-capacitor network also includes a second switched capacitor sub-circuit including a second pair of capacitors and a second set of switches. The switched-capacitor network further includes a third switched capacitor sub-circuit including a third pair of capacitors and a third set of switches. The switch controller is coupled to the switched-capacitor network, and is configured to operate the first set of switches, the second set of switches, and the third set of switches. More specifically, the switch controller is configured to operate the first set of switches to charge and discharge the first pair of capacitors according to a first charge timing that is phase-shifted in a first direction as compared with a second charge timing. The switch controller is also configured to operate the second set of switches to charge and discharge the second pair of capacitors according to the second charge timing. The switch controller is further configured to operate the third set of switches to charge and discharge the third pair of capacitors according to a third charge timing that is a phase-shifted in a second direction as compared with the second charge timing, wherein capacitance values for the first pair of capacitors are roughly equal to capacitance values for the third pair of capacitors.

Another example disclosed herein includes an input device. The input device includes a plurality of sensor electrodes and a discrete-time harmonic rejection mixer that is coupled to the plurality of sensor electrodes. The discrete-time harmonic rejection mixer includes a switched-capacitor network and a switch controller. The switched-capacitor network includes a first switched capacitor sub-circuit including a first pair of capacitors and a first set of switches. The switched-capacitor network also includes a second switched capacitor sub-circuit including a second pair of capacitors and a second set of switches. The switched-capacitor network further includes a third switched capacitor sub-circuit including a third pair of capacitors and a third set of switches. The switch controller is coupled to the switched-capacitor network, and is configured to operate the first set of switches, the second set of switches, and the third set of switches. More specifically, the switch controller is configured to operate the first set of switches to charge and discharge the first pair of capacitors according to a first charge timing that is phase-shifted in a first direction as compared with a second charge timing. The switch controller is also configured to operate the second set of switches to charge and discharge the second pair of capacitors according to the second charge timing. The switch controller is further configured to operate the third set of switches to charge and discharge the third pair of capacitors according to a third charge timing that is a phase-shifted in a second direction as compared with the second charge timing, wherein capacitance values for the first pair of capacitors are roughly equal to capacitance values for the third pair of capacitors.

Another example disclosed herein includes a method for rejecting harmonic components of a signal. The method includes operating a first set of switches included in a first switched capacitor sub-circuit that includes a first pair of capacitors and the first set of switches to charge and discharge the first pair of capacitors according to a first charge timing that is phase-shifted in a first direction as compared with a second charge timing. The method also includes operating a second set of switches included in a second switched capacitor sub-circuit that includes a second pair of capacitors and the second set of switches to charge and discharge the second pair of capacitors according to the second charge timing. The method further includes operating a third set of switches included in a third switched capacitor sub-circuit that includes a third pair of capacitors and the third set of switches to charge and discharge the third pair of capacitors according to a third charge timing that is a phase-shifted in a second direction as compared with the second charge timing. Capacitance values for the first pair of capacitors are roughly equal to capacitance values for the third pair of capacitors.

BRIEF DESCRIPTION OF THE DRAWINGS

So that the manner in which the above recited features of embodiments can be understood in detail, a more particular description of embodiments, briefly summarized above, may be had by reference to embodiments, some of which are illustrated in the appended drawings. It is to be noted, however, that the appended drawings illustrate only typical embodiments and are therefore not to be considered limiting of scope, for other effective embodiments may be admitted.

To facilitate understanding, identical reference numerals have been used, where possible, to designate identical elements that are common to the figures. It is contemplated that elements of one embodiment may be beneficially incorporated in other embodiments.

DETAILED DESCRIPTION

The following detailed description is merely exemplary in nature and is not intended to limit the embodiments or the application and uses of such embodiments. Furthermore, there is no intention to be bound by any expressed or implied theory presented in the preceding technical field, background, brief summary or the following detailed description.

Various embodiments provide a circuit that comprises a switched-capacitor harmonic-reject mixer. The circuit includes three channels or sub-circuits that operate together to reject specific frequencies that comprise harmonics of a subject frequency. Each sub-circuit includes a pair of capacitors that store sampled values input to the switched-capacitor harmonic-reject mixer. The sub-circuits are also configured to output the values to an output of the switched-capacitor harmonic-reject mixer. The different sub-circuits are operated in an out of phase manner to reject harmonic components in the combined output signal. The switched-capacitor harmonic-reject mixer can be used to filter harmonic components out of sampled signals in a signal within a capacitive sensing device that includes information from sensor electrodes. The switched-capacitor harmonic-reject mixer can also be used for other purposes as desired.

Figure 1:
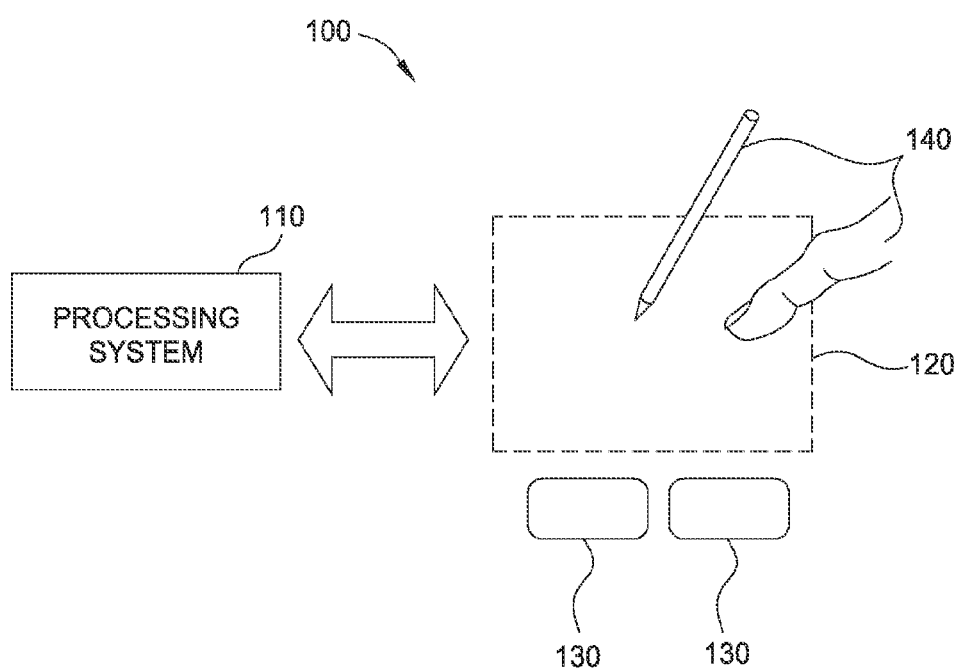
FIG. 1 is a block diagram of a system that includes an input device according to an example implementation.

Turning now to the figures, FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), BLUETOOTH® wireless technology standard, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in, and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques. Some implementations are configured to provide images that span one, two, three, or higher dimensional spaces. Some implementations are configured to provide projections of input along particular axes or planes. In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, changing the measured capacitive coupling. In one implementation, an absolute capacitance sensing method operates by modulating sensor electrodes with respect to a reference voltage (e.g., system ground) and by detecting the capacitive coupling between the sensor electrodes and input objects. Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals and/or to one or more sources of environmental interference (e.g., other electromagnetic signals). Sensor electrodes may be dedicated transmitters or receivers, or sensor electrodes may be configured to both transmit and receive. Alternatively, the receiver electrodes may be modulated relative to ground.

In FIG. 1, a processing system 110 is shown as part of the input device 100. The processing system 110 is configured to operate the hardware of the input device 100 to detect input in the sensing region 120. The processing system 110 comprises parts of, or all of, one or more integrated circuits (ICs) and/or other circuitry components. For example, a processing system for a mutual capacitance sensor device may comprise transmitter circuitry configured to transmit signals with transmitter sensor electrodes and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100 and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120 or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLEO), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2A:
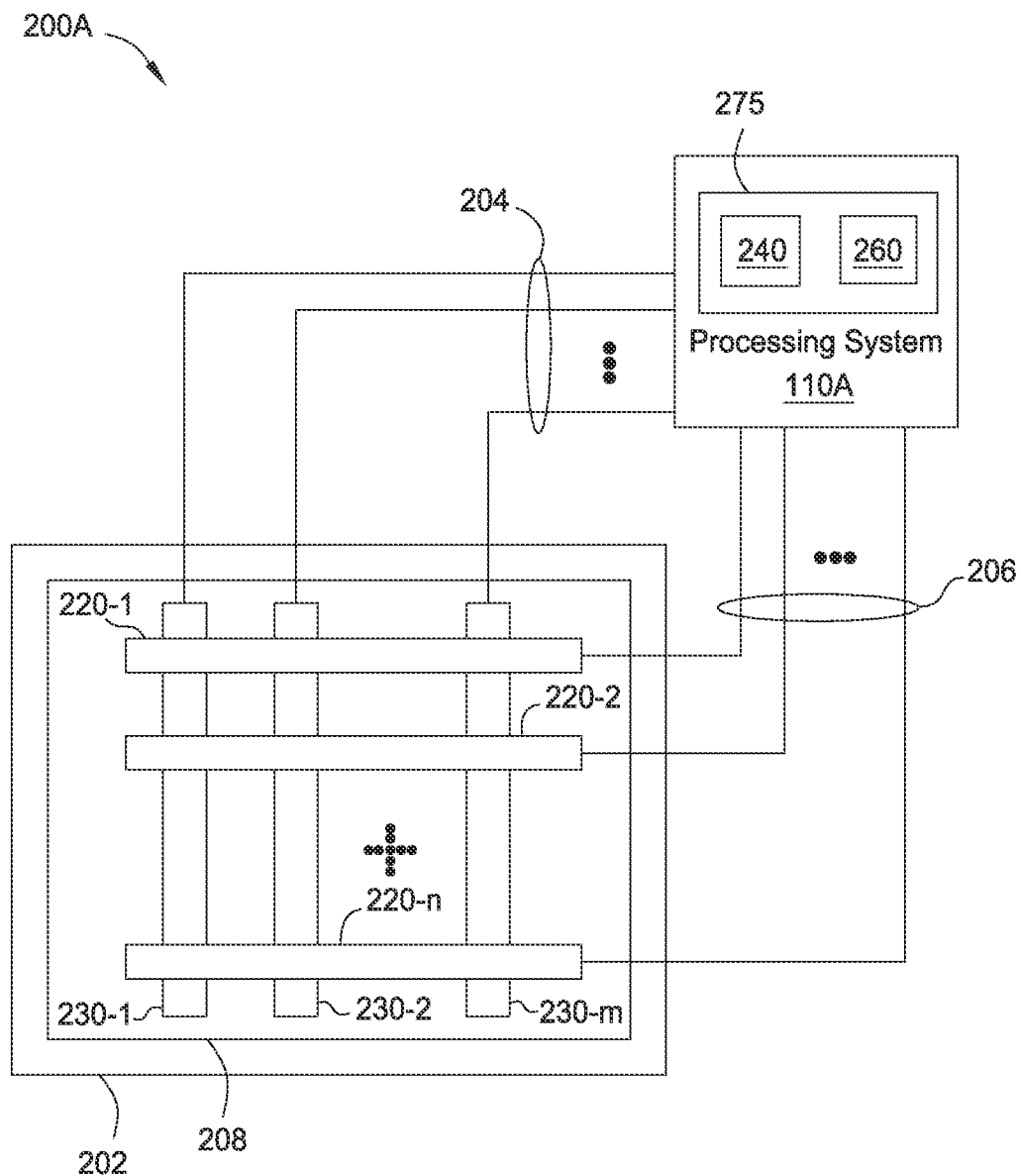
FIG. 2A is a block diagram depicting a capacitive sensor device according to an example implementation.

FIG. 2A is a block diagram depicting a capacitive sensor device 200A according to an example implementation. The capacitive sensor device 200A comprises an example implementation of the input device 100 shown in FIG. 1. The capacitive sensor device 200A includes a sensor electrode collection 208 coupled to an example implementation of the processing system 110 (referred to as "the processing system 110A"). As used herein, general reference to the processing system 110 is a reference to the processing system described in FIG. 1 or any other embodiment thereof described herein (e.g., the processing system 110A, 110B, etc.).

The sensor electrode collection 208 is disposed on a substrate 202 to provide the sensing region 120. The sensor electrode collection 208 includes sensor electrodes disposed on the substrate 202. In the present example, the sensor electrode collection 208 includes two pluralities of sensor electrodes 220-1 through 220-N (collectively "sensor electrodes 220"), and 230-1 through 230-M (collectively "sensor electrodes 230"), where M and N are integers greater than zero. The sensor electrodes 220 and 230 are separated by a dielectric (not shown). The sensor electrodes 220 and the sensor electrodes 230 can be non-parallel. In an example, the sensor electrodes 220 are disposed orthogonally with the sensor electrodes 230.

In some examples, the sensor electrodes 220 and the sensor electrodes 230 can be disposed on separate layers of the substrate 202. In other examples, the sensor electrodes 220 and the sensor electrodes 230 can be disposed on a single layer of the substrate 202. While the sensor electrodes are shown disposed on a single substrate 202, in some embodiments, the sensor electrodes can be disposed on more than one substrate. For example, some sensor electrodes can be disposed on a first substrate, and other sensor electrodes can be disposed on a second substrate adhered to the first substrate.

In the present example, the sensor electrode collection 208 is shown with the sensor electrodes 220, 230 generally arranged in a rectangular grid of intersections of orthogonal sensor electrodes. It is to be understood that the sensor electrode collection 208 is not limited to such an arrangement, but instead can include numerous sensor patterns. Although the sensor electrode collection 208 is depicted as rectangular, the sensor electrode collection 208 can have other shapes, such as a circular shape.

As discussed below, the processing system 110A can operate the sensor electrodes 220, 230 according to a plurality of excitation schemes, including excitation scheme(s) for mutual capacitance sensing ("transcapacitive sensing") and/or self-capacitance sensing ("absolute capacitive sensing"). In a transcapacitive excitation scheme, the processing system 110A drives the sensor electrodes 230 with transmitter signals (the sensor electrodes 230 are "transmitter electrodes"), and receives resulting signals from the sensor electrodes 220 (the sensor electrodes 220 are "receiver electrodes"). The sensor electrodes 230 can have the same or different geometry as the sensor electrodes 220. In an example, the sensor electrodes 230 are wider and more closely distributed than the sensor electrodes 220, which are thinner and more sparsely distributed. Similarly, in an embodiment, sensor electrodes 220 may be wider and/or more sparsely distributed. Alternatively, the sensor electrodes 220, 230 can have the same width and/or the same distribution.

The sensor electrodes 220 and the sensor electrodes 230 are coupled to the processing system 110A by conductive routing traces 204 and conductive routing traces 206, respectively. The processing system 110A is coupled to the sensor electrodes 220, 230 through the conductive routing traces 204, 206 to implement the sensing region 120 for sensing inputs. Each of the sensor electrodes 220 can be coupled to at least one routing trace of the routing traces 206. Likewise, each of the sensor electrodes 230 can be coupled to at least one routing trace of the routing traces 204.

Figure 2B:
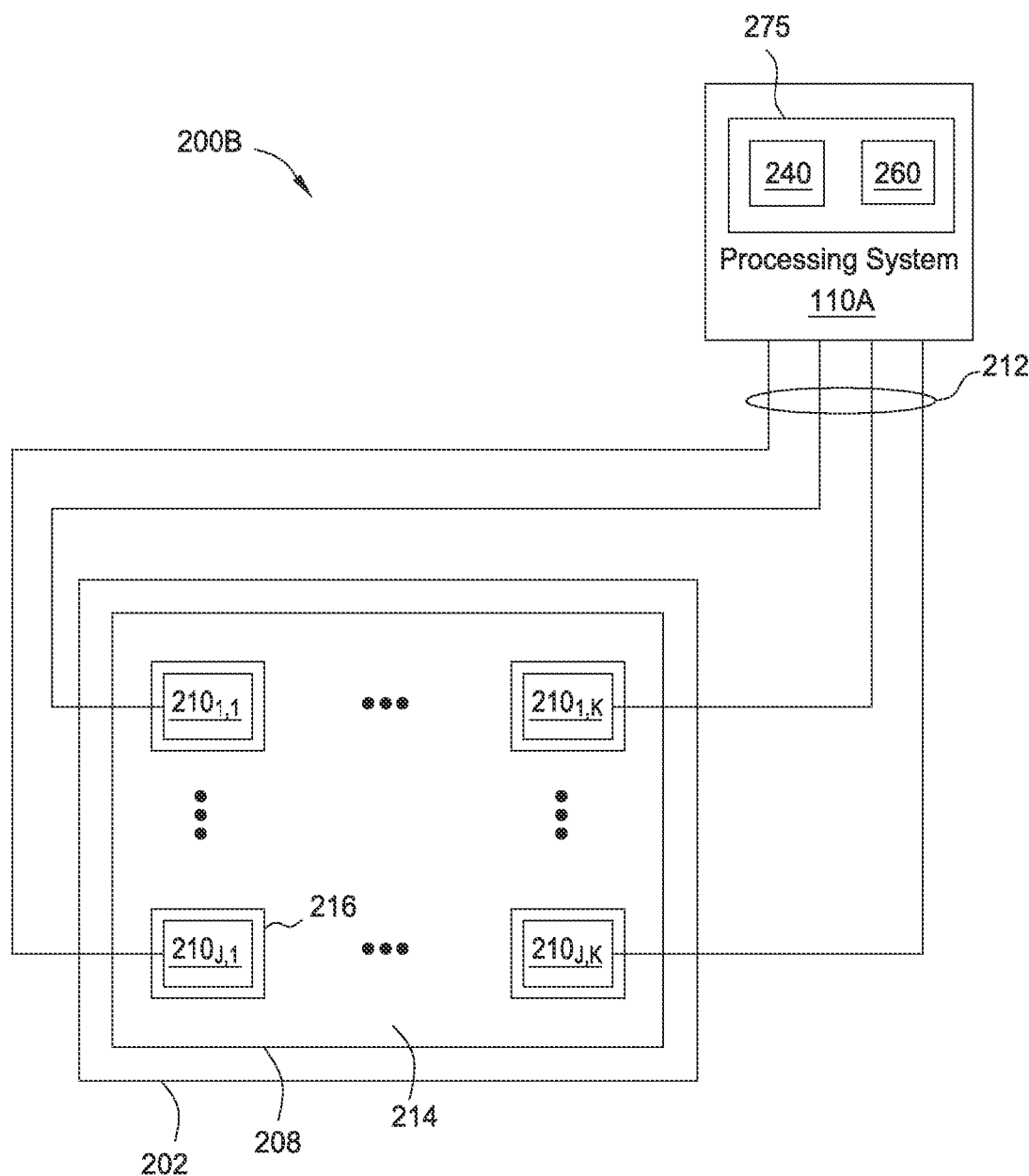
FIG. 2B is a block diagram depicting another capacitive sensor device according to an example implementation.

FIG. 2B is a block diagram depicting a capacitive sensor device 200B according to an example implementation. The capacitive sensor device 200B comprises another example implementation of the input device 100 shown in FIG. 1. In the present example, the sensor electrode collection 208 includes a plurality of sensor electrodes $210_{1,1}$ through $210_{J,K}$, where J and K are integers (collectively "sensor electrodes 210"). The sensor electrodes 210 are capacitively coupled to a grid electrode 214. The sensor electrodes 210 are ohmically isolated from each other and the grid electrode 214. The sensor electrodes 210 can be separated from the grid electrode 214 by a gap 216. In the present example, the sensor electrodes 210 are arranged in a rectangular matrix pattern, where at least one of J or K is greater than zero. The sensor electrodes 210 can be arranged in other patterns, such as polar arrays, repeating patterns, non-repeating patterns, or like type arrangements. Similar to the capacitive sensor device 200A, the processing system 110A can operate the sensor electrodes 210 and the grid electrode 214 according to a plurality of excitation schemes, including excitation scheme(s) for transcapacitive sensing and/or absolute capacitive sensing.

In some examples, the sensor electrodes 210 and the grid electrode 214 can be disposed on separate layers of the substrate 202. In other examples, the sensor electrodes 210 and the grid electrode 214 can be disposed on a single layer of the substrate 202. The electrodes 210 can be on the same and/or different layers as the sensor electrodes 220 and the sensor electrodes 230. While the sensor electrodes are shown disposed on a single substrate 202, in some embodiments, the sensor electrodes can be disposed on more than one substrate. For example, some sensor electrodes can be disposed on a first substrate, and other sensor electrodes can be disposed on a second substrate adhered to the first substrate.

The sensor electrodes 210 are coupled to the processing system 110A by conductive routing traces 212. The processing system 110A can also be coupled to the grid electrode 214 through one or more routing traces (not shown for clarity). The processing system 110A is coupled to the sensor electrodes 210 through the conductive routing traces 212 to implement the sensing region 120 for sensing inputs.

Referring to FIGS. 2A and 2B, the capacitive sensor device 200A or 200B can be utilized to communicate user input (e.g., a user's finger, a probe such as a stylus, and/or some other external input object) to an electronic system (e.g., computing device or other electronic device). For example, the capacitive sensor device 200A or 200B can be implemented as a capacitive touch screen device that can be placed over an underlying image or information display device (not shown). In this manner, a user would view the underlying image or information display by looking through substantially transparent elements in the sensor electrode collection 208. When implemented in a touch screen, the substrate 202 can include at least one substantially transparent layer (not shown). The sensor electrodes and the conductive routing traces can be formed of substantially transparent conductive material. Indium tin oxide (ITO) and/or thin, barely visible wires are but two of many possible examples of substantially transparent material that can be used to form the sensor electrodes and/or the conductive routing traces. In other examples, the conductive routing traces can be formed of non-transparent material, and then hidden in a border region (not shown) of the sensor electrode collection 208.

In another example, the capacitive sensor device 200A or 200B can be implemented as a capacitive touchpad, slider, button, or other capacitance sensor. For example, the substrate 202 can be implemented with, but not limited to, one or more clear or opaque materials. Likewise, clear or opaque conductive materials can be utilized to form sensor electrodes and/or conductive routing traces for the sensor electrode collection 208.

In general, the processing system 110A excites or drives sensing elements of the sensor electrode collection 208 with a sensing signal and measures an induced or resulting signal that includes the sensing signal and effects of input in the sensing region 120. The terms "excite" and "drive" as used herein encompasses controlling some electrical aspect of the driven element. For example, it is possible to drive current through a wire, drive charge into a conductor, drive a substantially constant or varying voltage waveform onto an electrode, etc. A sensing signal can be constant, substantially constant, or varying over time, and generally includes a shape, frequency, amplitude, and phase. A sensing signal can be referred to as an "active signal" as opposed to a "passive signal," such as a ground signal or other reference signal. A sensing signal can also be referred to as a "transmitter signal" when used in transcapacitive sensing, or an "absolute sensing signal" or "modulated signal" when used in absolute sensing.

In an example, the processing system 110A drives sensing element(s) of the sensor electrode collection 208 with a voltage and senses resulting respective charge on sensing element(s). That is, the sensing signal is a voltage signal and the resulting signal is a charge signal (e.g., a signal indicative of accumulated charge, such as an integrated current signal). Capacitance is proportional to applied voltage and inversely proportional to accumulated charge. The processing system 110A can determine measurement(s) of capacitance from the sensed charge. In another example, the processing system 110A drives sensing element(s) of the sensor electrode collection 208 with charge and senses resulting respective voltage on sensing element(s). That is, the sensing signal is a signal to cause accumulation of charge (e.g., current signal) and the resulting signal is a voltage signal. The processing system 110A can determine measurement(s) of capacitance from the sensed voltage. In general, the term "sensing signal" is meant to encompass both driving voltage to sense charge and driving charge to sense voltage, as well as any other type of signal that can be used to obtain indicia of capacitance. "Indicia of capacitance" include measurements of charge, current, voltage, and the like, from which capacitance can be derived.

The processing system 110A can include a sensor module 240 and a determination module 260. The sensor module 240 and the determination module 260 comprise modules that perform different functions of the processing system 110A. In other examples, different configurations of one or more modules can perform the functions described herein. The sensor module 240 and the determination module 260 can include circuitry 275 and can also include firmware, software, or a combination thereof operating in cooperation with the circuitry 275.

The sensor module 240 selectively drives sensing signal(s) on one or more sensing elements of the sensor electrode collection 208 over one or more cycles ("excitation cycles") in accordance with one or more schemes ("excitation schemes"). During each excitation cycle, the sensor module 240 can selectively sense resulting signal(s) from one or more sensing elements of the sensor electrode collection 208. Each excitation cycle has an associated time period during which sensing signals are driven and resulting signals measured.

In one type of excitation scheme, the sensor module 240 can selectively drive sensing elements of the sensor electrode collection 208 for absolute capacitive sensing. In absolute capacitive sensing, the sensor module 240 drives selected sensing element(s) with an absolute sensing signal and senses resulting signal(s) from the selected sensing element(s). In such an excitation scheme, measurements of absolute capacitance between the selected sensing element(s) and input object(s) are determined from the resulting signal(s). In an example, the sensor module 240 can drive selected sensor electrodes 220, and/or selected sensor electrodes 230, with an absolute sensing signal. In another example, the sensor module 240 can drive selected sensor electrodes 210 with an absolute sensing signal.

In another type of excitation scheme, the sensor module 240 can selectively drive sensing elements of the sensor electrode collection 208 for transcapacitive sensing. In transcapacitive sensing, the sensor module 240 drives selected transmitter sensor electrodes with transmitter signal(s) and senses resulting signals from selected receiver sensor electrodes. In such an excitation scheme, measurements of transcapacitance between transmitter and receiver electrodes are determined from the resulting signals. In an example, the sensor module 240 can drive the sensor electrodes 230 with transmitter signal(s) and receive resulting signals on the sensor electrodes 220. In another example, the sensor module 240 can drive selected sensor electrodes 210 with transmitter signal(s), and receive resulting signals from others of the sensor electrodes 210.

In any excitation cycle, the sensor module 240 can drive sensing elements of the sensor electrode collection 208 with other signals, including reference signals and guard signals. That is, those sensing elements of the sensor electrode collection 208 that are not driven with a sensing signal, or sensed to receive resulting signals, can be driven with a reference signal, a guard signal, or left floating (i.e., not driven with any signal). A reference signal can be a ground signal (e.g., system ground) or any other constant or substantially constant voltage signal. A guard signal can be a signal that is similar or the same in at least one of shape, amplitude, frequency, or phase of a transmitter signal.

"System ground" may indicate a common voltage shared by system components. For example, a capacitive sensing system of a mobile phone can, at times, be referenced to a system ground provided by the phone's power source (e.g., a charger or battery). The system ground may not be fixed relative to earth or any other reference. For example, a mobile phone on a table usually has a floating system ground. A mobile phone being held by a person who is strongly coupled to earth ground through free space may be grounded relative to the person, but the person-ground may be varying relative to earth ground. In many systems, the system ground is connected to, or provided by, the largest area electrode in the system. The capacitive sensor device 200A or 200B can be located proximate to such a system ground electrode (e.g., located above a ground plane or backplane).

The determination module 260 performs capacitance measurements based on resulting signals obtained by the sensor module 240. The capacitance measurements can include changes in capacitive couplings between elements (also referred to as "changes in capacitance"). For example, the determination module 260 can determine baseline measurements of capacitive couplings between elements without the presence of input object(s). The determination module 260 can then combine the baseline measurements of capacitive couplings with measurements of capacitive couplings in the presence of input object(s) to determine changes in capacitive couplings.

In an example, the determination module 260 can perform a plurality of capacitance measurements associated with specific portions of the sensing region 120 as "capacitive pixels" to create a "capacitive image" or "capacitive frame." A capacitive pixel of a capacitive image represents a location within the sensing region 120 in which a capacitive coupling can be measured using sensing elements of the sensor electrode collection 208. For example, a capacitive pixel can correspond to a transcapacitive coupling between a sensor electrode 220 and a sensor electrode 230 affected by input object(s). In another example, a capacitive pixel can correspond to an absolute capacitance of a sensor electrode 210. The determination module 260 can determine an array of capacitive coupling changes using the resulting signals obtained by the sensor module 240 to produce an x-by-y array of capacitive pixels that form a capacitive image. The capacitive image can be obtained using transcapacitive sensing (e.g., transcapacitive image), or obtained using absolute capacitive sensing (e.g., absolute capacitive image). In this manner, the processing system 110A can capture a capacitive image that is a snapshot of the response measured in relation to input object(s) in the sensing region 120. A given capacitive image can include all of the capacitive pixels in the sensing region, or only a subset of the capacitive pixels.

In another example, the determination module 260 can perform a plurality of capacitance measurements associated with a particular axis of the sensing region 120 to create a "capacitive profile" along that axis. For example, the determination module 260 can determine an array of absolute capacitive coupling changes along an axis defined by the sensor electrodes 220 and/or the sensor electrodes 230 to produce capacitive profile(s). The array of capacitive coupling changes can include a number of points less than or equal to the number of sensor electrodes along the given axis.

Measurement(s) of capacitance by the processing system 110A, such as capacitive image(s) or capacitive profile(s), enable the sensing of contact, hovering, or other user input with respect to the formed sensing regions by the sensor electrode collection 208. The determination module 260 can utilize the measurements of capacitance to determine positional information with respect to a user input relative to the sensing regions formed by the sensor electrode collection 208. The determination module 260 can additionally or alternatively use such measurement(s) to determine input object size and/or input object type.

Signals received from sensing electrodes may be sampled to form sampled signals (As is generally understood, a sampled signal is a signal with discrete values, as opposed to continuously-changing values.). These sampled signals may include undesirable noise components at or near harmonic frequencies of a sensing frequency. More specifically, as described above, to sense with sensor electrodes, the processing system 110 drives the sensor electrodes with a sensing signal having a sensing frequency. The sensing frequency of the sensing signal may be altered by the processing system. For example, the sensing frequency may be switched from a first frequency to a second frequency if noise exceeding a threshold is detected at or near the first frequency. The sensing frequency may also be programmatically altered in order to drive the sensor electrodes with multiple sensing signals at multiple frequencies and utilize one or more of the corresponding resulting signals in order to detect an input object. An input object 140 may modulate the sensing signal to generate a resulting signal. The processing system 110 analyzes the resulting signal to determine presence of the input object 140. The resulting signals may include noise components having frequencies at or near harmonic components of the sensing signal. If such noise components are present with frequencies at or near these harmonic components, then the ability to detect presence of an input object 140 may be hindered.

Figure 3:
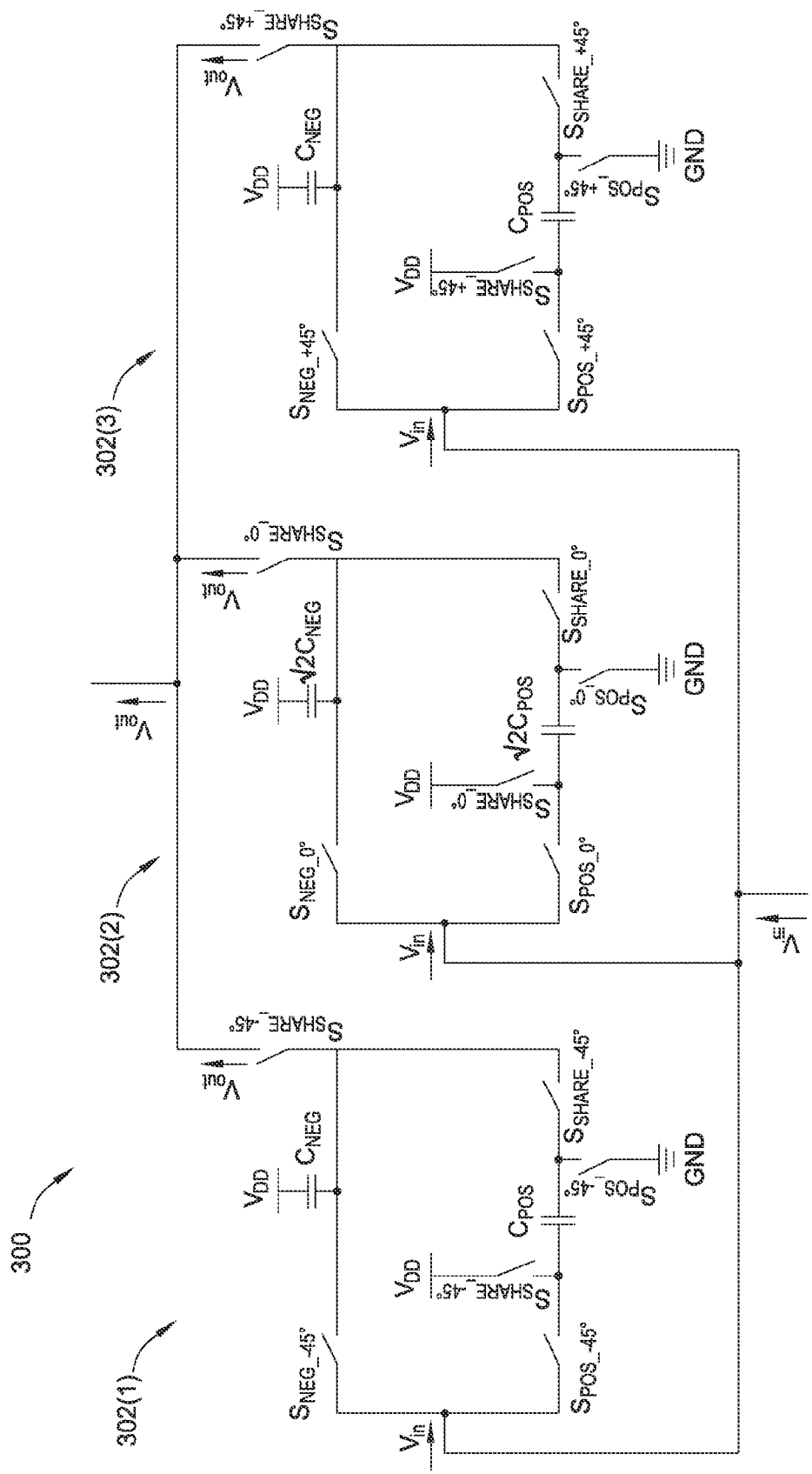
FIG. 3 illustrates a circuit for filtering harmonic frequency components from a sampled signal.

FIG. 3 provides a circuit for filtering harmonic frequency components from a sampled signal (also referred to herein as a "subject signal"), where the harmonic frequency components are harmonics of a subject frequency component of the subject signal. In one example, a subject signal comprises a sensing signal with which sensor electrodes are driven and the subject frequency comprises the fundamental frequency of that sensing signal. In various embodiments, the sensing signal may comprise a single signal or a plurality of signals driven onto the sensor electrodes. The circuit generally comprises a switched-capacitor harmonic-reject mixer 300. The switched-capacitor harmonic-reject mixer 300 includes three sub-circuits 302 with similar but differently-tuned components. Specifically, each sub-circuit 302 includes capacitors (labeled with "C" and a subscript) that store charges at different times and then release the stored charges together. The timings with which the capacitors store and release charge are controlled by switches (labeled with "S" and a subscript). The switches may be controlled by a switch controller (not shown) that provides activation signals according to a timing schedule as described in detail below.

More specifically, each sub-circuit 302 receives input (marked with "$V_{in}$"), (the "subject signal") which constitutes input to the switched-capacitor harmonic-reject mixer 300. A negative timing switch (marked "$S_{NEG\_\_\_\_\_}$") and a positive timing switch (marked "$S_{POS\_\_\_\_\_}$") are coupled to the input. "$S_{NEG}$" is coupled in parallel with a negative-timing capacitor (marked "$C_{NEG}$") that is coupled to a power supply voltage ("$V_{DD}$") and with a first shared-timing switch (marked "$S_{SHARE\_\_\_\_\_}$"). In any of the foregoing symbols, a blank (i.e., "_____") refers to an additional notation that describes the phase shifting of the circuit element associated with the particular symbol. For example, $SNEG_{-45°}$ means a circuit component that is shifted backwards by 45°. $S_{POS}$ is coupled in parallel with a second shared timing switch (also marked "$S_{SHARE}$") that is coupled to $V_{DD}$ and with a positive-timing capacitor (marked "$C_{POS}$"). $C_{POS}$ is coupled in parallel with $S_{POS}$, which is coupled to ground (marked "GND") and with a third shared-timing switch. The third shared-timing timing switch is coupled to the first shared timing switch, which is coupled to an output. The inputs from each sub-circuit 302 are coupled together and the outputs from each sub-circuit 302 are coupled together. For additional utility, a capacitor may be placed after $V_{OUT}$ to store the value at $V_{OUT}$. Note that although the switches (including shared-timing switches, positive timing switches and negative timing switches) are shown as coupled to a particular voltage, these switches may instead be coupled to any other voltage source, such as $V_{DD}$, $V_{DD}/2$, GND, or any other voltage.

The switches cause $C_{NEG}$ and $C_{POS}$ to charge and discharge according to a specific timing. More specifically, $S_{NEG}$ causes a $C_{NEG}$ to be charged at a negative timing point. Additionally, $S_{POS}$ causes $C_{POS}$ to be charged at a positive timing point. The shared-timing switches ($S_{SHARE}$), placed after $C_{NEG}$ and before and after $C_{POS}$, activate together to cause the charges stored in $C_{NEG}$ and $C_{POS}$ to be shared and stored at the output. In general, the negative timing point lies in a first half-period of the subject frequency and the positive timing point lies in a second half-period of the subject frequency. Thus, the capacitors for each sub-circuit 302 sample the input signal twice per period of the subject frequency. Each switch is opened before the next switch is closed. Thus $S_{NEG}$ is opened before $S_{POS}$ is closed and $S_{POS}$ is opened before $S_{SHARE}$ is closed.

The sub-circuits 302 are generally operated in an out-of-phase manner with respect to one another. More specifically, the timings for the switches in the first sub-circuit 302(1) are phase-shifted by negative 45 degrees with respect to the switches in the second sub-circuit 302(2). Further, the timings for the switches in the third sub-circuit 302(3) are phase-shifted by positive 45 degrees with respect to the switches in the second sub-circuit 302(2). The 45 degree timing period is with reference to the subject frequency. With capacitive touch sensing, this subject frequency is the sensing frequency—the fundamental frequency of the sensing frequency with which sensor electrodes are driven. Phase shifting by negative 45 degrees thus means that the timings for the corresponding switches are shifted forward in time by one eighth of a period corresponding to the subject frequency, while phase shifting by positive 45 degrees means that the timings for the corresponding switches are shifted backwards in time by one eighth of a period corresponding to the subject frequency. These timings will be described in more detail below with reference to FIG. 4.

The values for the capacitors $C_{POS}$ and $C_{NEG}$ may be roughly equivalent to each other within the first and third sub-circuits 302. Within the second sub-circuit 302(2), the capacitors $C_{POS}$ and $C_{NEG}$ have an increased capacitance value as compared with the capacitors in the first sub-circuit 302(1) and the third sub-circuit 302(3). More specifically, the capacitance values for $C_{POS}$ and $C_{NEG}$ in the second sub-circuit 302(2) are increased by a factor of $\sqrt{2}$ as compared with $C_{POS}$ and $C_{NEG}$ in the first sub-circuit 302(1) and the third sub-circuit 302(3). $C_{POS}$ and $C_{NEG}$ may have values equal to several hundred femtofarads.

The signals output by each sub-circuit 302 are combined together because of the coupling of shared timing switches outputting $V_{OUT}$. Thus, the final output signal of switched-capacitor harmonic-reject mixer 300 is a combination of the signals output by each sub-circuit 302.

The switched-capacitor harmonic-reject mixer 300 configured as described above operates to filter out even harmonics of the subject frequency as well as the $3^{rd}$ and $5^{th}$ (odd) harmonics of the subject frequency. One additional feature of the switched-capacitor harmonic-reject mixer 300 is that the mixer 300 can be operated as a demodulator instead of as a harmonic-reject mixer. By operating the switches of the different sub-circuits 302 in unison, instead of out of phase, the mixer 300 operates as a demodulator. Operating the switches in unison means that the all $S_{NEG}$ switches are operated in unison, all $S_{POS}$ switches are operated in unison, and all $S_{SHARE}$ switches are operated in unison. However, $S_{NEG}$ does not operate in unison with $S_{POS}$ or with $S_{SHARE}$. For example, the $S_{NEG}$ switch of the first sub-circuit 302(1), the $S_{NEG}$ switch of the second sub-circuit 302(2), and the $S_{NEG}$ switch of the third sub-circuit 302(3) all open and close at approximately the same time. However, as with what is described above, $S_{NEG}$ closes in a first half-period corresponding to the subject frequency, $S_{POS}$ closes in a second half-period corresponding to the subject frequency, and $S_{SHARE}$ closes after $S_{POS}$ closes. A control bit may be used to control the switch controller to alternate between operating in the harmonic-reject mode and the demodulator mode. Although three sub-circuits 302 are described above as operating in unison to operate as the demodulator, on some embodiments, only a single sub-circuit 302 may be operated, while the other sub-circuits 302 are shut off, to operate as the demodulator.

Figure 4:
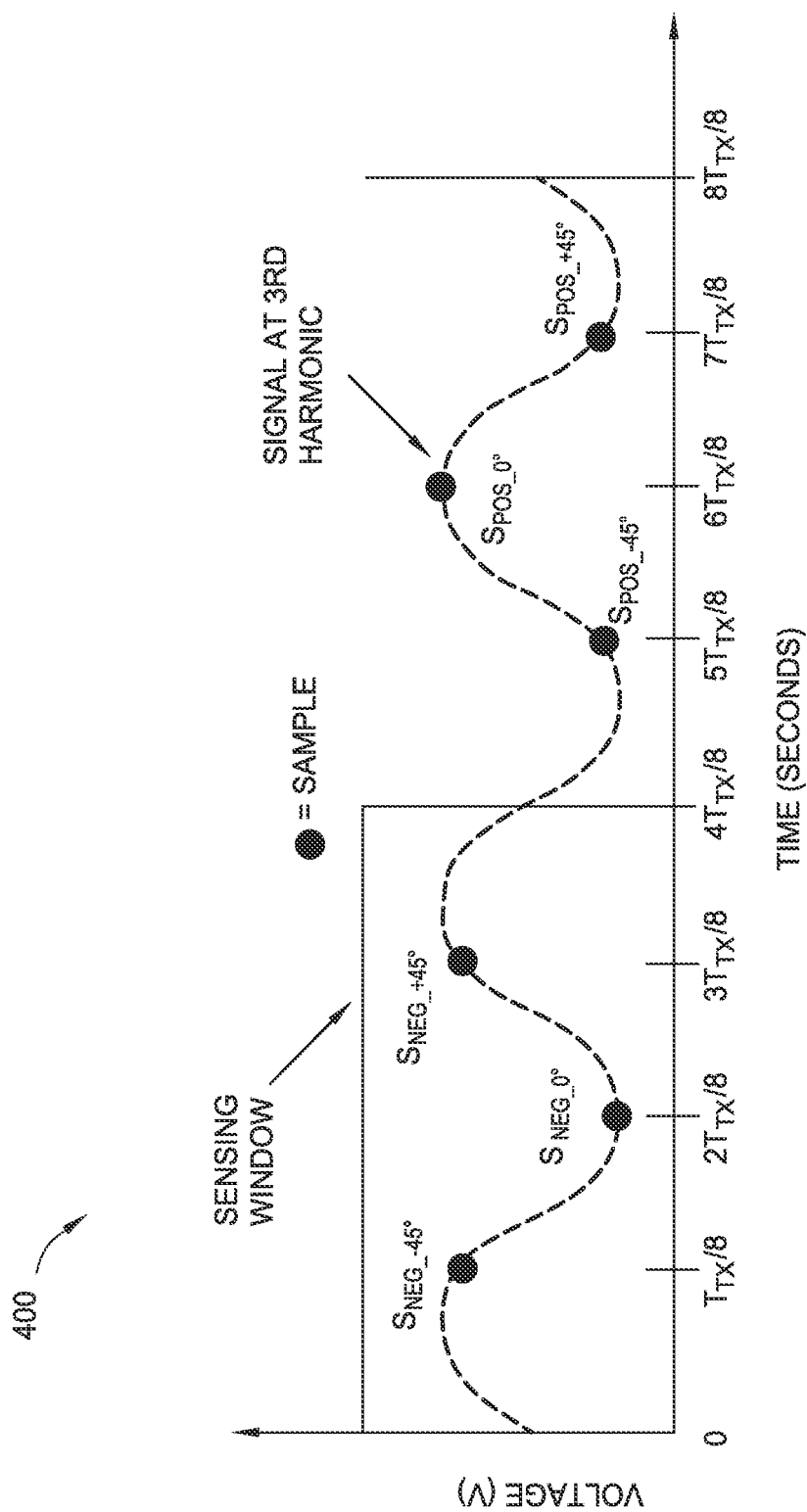
FIG. 4 is a graph that illustrates, in more detail, the timings for operating the switches illustrated in FIG. 3.

FIG. 4 is a graph 400 that illustrates, in more detail, the timings for operating the switches illustrated in FIG. 3. The graph plots time on the x-axis versus voltage on the y-axis. The time shown on the x-axis illustrates a period corresponding to the reference frequency (again, for capacitive touch sensing, this reference frequency is the sensing frequency). The reference signal is illustrated in FIG. 4 as a square wave, with the first half of the period illustrated as high and the second half illustrated as low. The period of the square wave is denoted in FIG. 4 with the symbol "$T_{TX}$." In FIG. 4, the period of the square wave is divided into eight segments for illustration of the timings of the switch activations, because the switch activations are shifted for the different sub-circuits 302 by 45° (since 45° is ⅛ of 360°). The graph 400 shows that the switches for the first sub-circuit 302(1) are operated 45° in advance of the switches for the second sub-circuit 302(2), which are operated 45° in advance of the switches for the third sub-circuit 302(3). Although not shown, $S_{SHARE}$ for a particular sub-circuit 302 may be closed at any time after $S_{POS}$ for that sub-circuit. FIG. 4 shows a third harmonic of the reference signal (sensing signal) to illustrate where the samples taken fall with respect to that harmonic.

When the switches are operated with the timings illustrated in FIG. 4, the difference expression for the switched-capacitor harmonic-reject mixer 300 can be expressed as follows:

$$V_{OUT}[n]=(V_{IN}[n-6]+\sqrt{2}*V_{IN}[n-5]+V_{IN}[n-4]-V_{IN}[2-4]-\sqrt{2}*V_{IN}[n-1]-V_{IN}[n])/(4+2*\sqrt{2})+V_{DD}/2$$

Writing this expression as a z-transform yields the following transfer function:

$$(V_{OUT}(z)/V_{IN}(Z))=(-z^6-\sqrt{2}*z^5-z^4+z^2+\sqrt{2}*z+1)/((4+2*\sqrt{2})*z^6), T_{SAMPLE}=T_{TX}/8$$

The indication "$T_{SAMPLE}=T_{TX}/8$" means that the sampling period is equal to the sensing period (1/sensing frequency) divided by 8. These expressions assume that $C_{POS}=C_{NEG}$.

Figure 5:
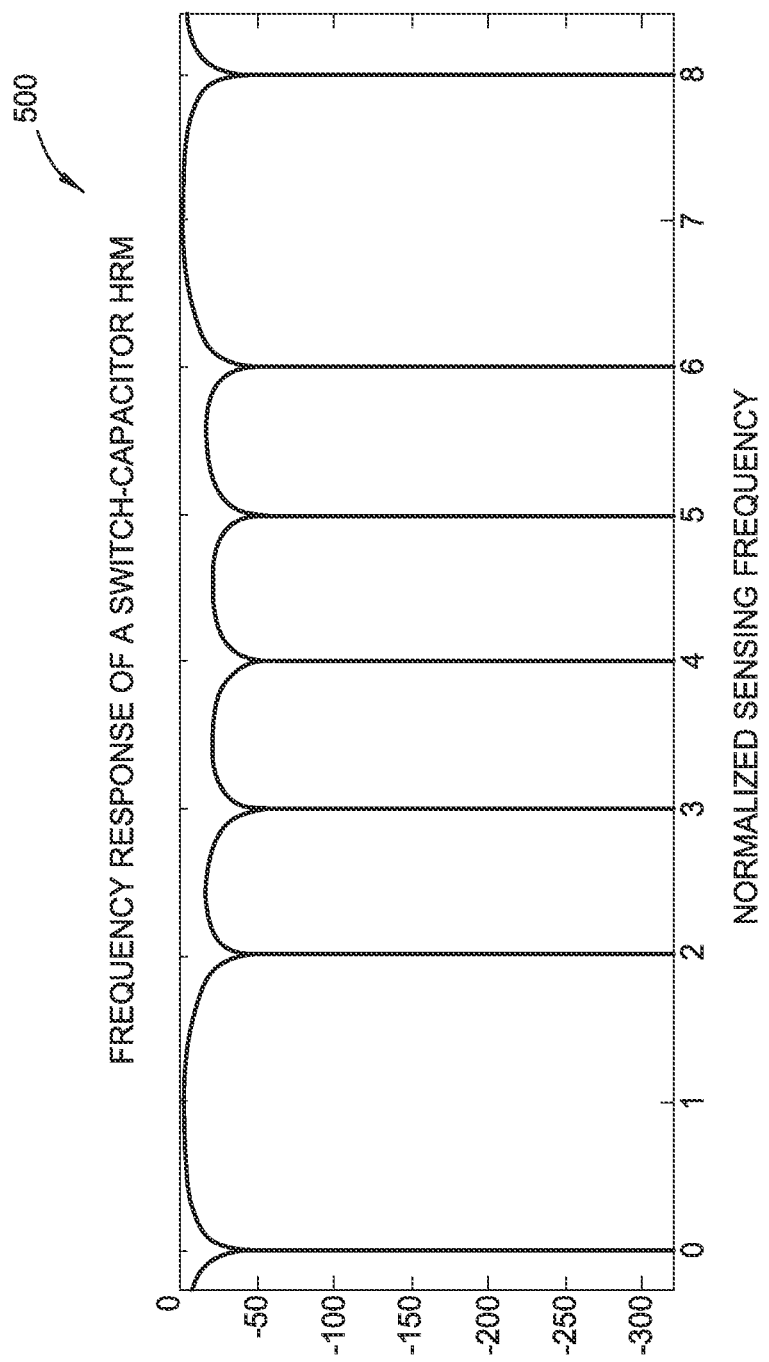
FIG. 5 is a graph that illustrates the frequency response of the switched-capacitor harmonic-reject mixer operated as described above.

FIG. 5 is a graph 500 that illustrates the frequency response of the switched-capacitor harmonic-reject mixer 300 operated as described above. This filter includes nulls at, and thus attenuates, frequencies at even harmonics, as well as at third and fifth harmonics of a reference frequency. Thus, the mixer 300 is able to filter out noise components that could have an effect on the ability to process a signal including third and fifth harmonics of a fundamental frequency.

Figure 6:
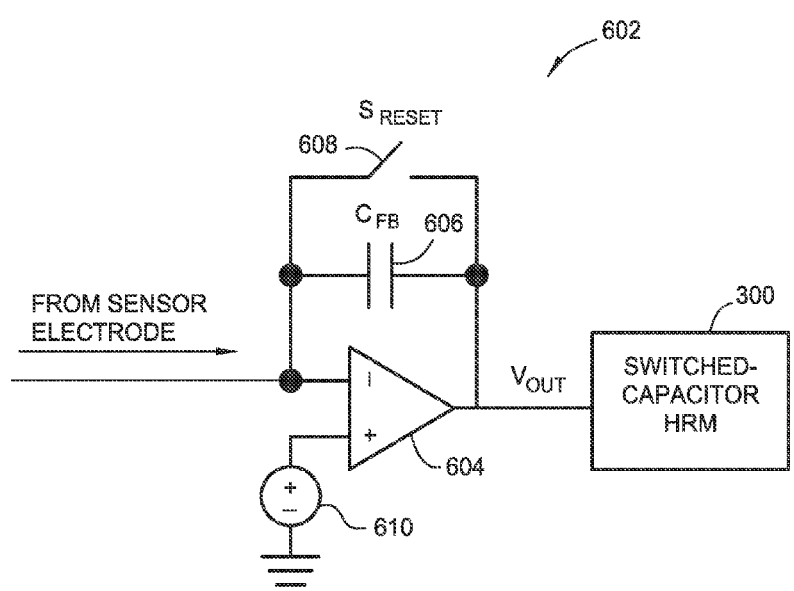
FIG. 6 illustrates usage of the switched-capacitor harmonic-reject filter in conjunction with capacitive sensing.

FIG. 6 illustrates usage of the switched-capacitor harmonic-reject mixer 300 in conjunction with capacitive sensing. More specifically, processing system 110 drives one or more sensor electrodes with a sensing signal. A front-end circuit 602 that acts as an integrator receives signals from the sensor electrode.

The front-end circuit 602 generally includes an operational amplifier 604, a feedback capacitor 606 ("$C_{FB}$") and a reset switch 608 ("$S_{RESET}$"). The non-inverting input of the operational amplifier 604 is coupled to a voltage source 610. The inverting input of the operational amplifier 604 is coupled, through the capacitor 606 and the resetting switch 608 in parallel, to the output of the operational amplifier 604. The front-end circuit 602 samples the signal received from the sensor electrodes and outputs the sampled signal to the switched-capacitor harmonic-reject mixer 300. The reset switch 608 discharges the capacitor 606 after each sample taken.

The switched-capacitor harmonic-reject mixer 300, which operates with timings tuned to the sensing frequency, filters the even harmonics and third and fifth harmonics of the sensing frequency from the received signal. Operating with timings tuned to the sensing frequency means that the $S_{NEG}$, $S_{POS}$, and $S_{SHARED}$ switches each operate (open and close) at the fundamental frequency of the sensing signal. In other words, $T_{TX}$, shown in FIG. 4, is equal to the reciprocal of the fundamental frequency of the sensing signal.

The front-end circuit 602 may be operated in a "stretch" mode. A stretch mode is a mode in which the front-end circuit 602 samples an incoming signal for a shorter duration than the period corresponding to the sensing frequency. More specifically, a time-limiting switch may be placed between the sensor electrode and the front-end circuit 602 (i.e., at the inverting input of the front-end circuit) to shorten the amount of time front-end circuit 602 is integrating the received signal. For clarity, a half sensing period $T_{TX}/2$ is equivalent to $T_{RESET}+T_{INTEGRATION}+T_{STRETCH}$, where $T_{INTEGRATION}$ is the time during which the signal is integrated, $T_{STRETCH}$ is the time during which the time-limiting switch is opened to prevent integration, and $T_{RESET}$ is the time during which a reset switch is closed to reset the integration circuitry. The purpose of shortening the amount of time the front-end circuit 602 integrates the received signal is to allow the sensor signal to be operated at a slower frequency while also allowing the front-end circuit 602 to sample a signal as if that signal were being operated at a faster frequency. During each half-period of the slower frequency, the time-limiting switch is closed for a time equal to a half-period of the faster frequency and then opened for the remainder of the half-period of the slower frequency. By limiting the integration time in this manner, the amount of charge that is integrated is substantially the same as if the front-end circuit 602 were operating at a frequency equal to $T_{INTEGRATION}$. This timing scheme results in a situation where the total time during which the front-end circuit 602 is receiving signal is equal to the period corresponding to the faster frequency, during each period of the slower frequency.

When the front-end circuit 602 is operated in the stretch mode, and the switches of the switched-capacitor harmonic-reject mixer 300 operates according to timings associated with the faster frequency, the switched-capacitor harmonic reject mixer 300 operates to filter out third and fifth harmonics of the faster frequency (rather than the slower frequency). The following expressions are presented to demonstrate operation of the switched-capacitor harmonic-reject mixer 300 with stretch mode.

A difference expression and a z-transform transfer function for the stretch mode are provided. A variable α is defined as:

$$\alpha=(T_{RESET}+T_{STRETCH})/(T_{TX}/8)$$

The difference expression can be expressed as follows:

$$V_{OUT}[n]=(V_{IN}[n-(5+\alpha)]+\sqrt{2}*V_{IN}[n-(4+\alpha)]+V_{IN}[n-(3+\alpha)]-V_{IN}[n-2]-\sqrt{2}*V_{IN}[n-1]V_{IN}[n])/(4+2*\sqrt{2})+V_{DD}/2$$

Writing this expression as a z-transform yields the following transfer function:

$$V_{OUT}(z)/V_{IN}(z)=(-z^{5+\alpha}-\sqrt{2}*z^{4+\alpha}-z^{3+\alpha}+z^2+\sqrt{2}*z+1)/((4+2*\sqrt{2})*z^{5+\alpha}), T_{SAMPLE}=T_{TX}/8$$

The indication "$T_{SAMPLE}=T_{TX}/8$" means that the sampling period is equal to the sensing period (1/sensing frequency) divided by 8. For α>1, the $3^{rd}$ and $5^{th}$ harmonics of the faster frequency, rather than the slower frequency, are rejected.

Figure 7A:
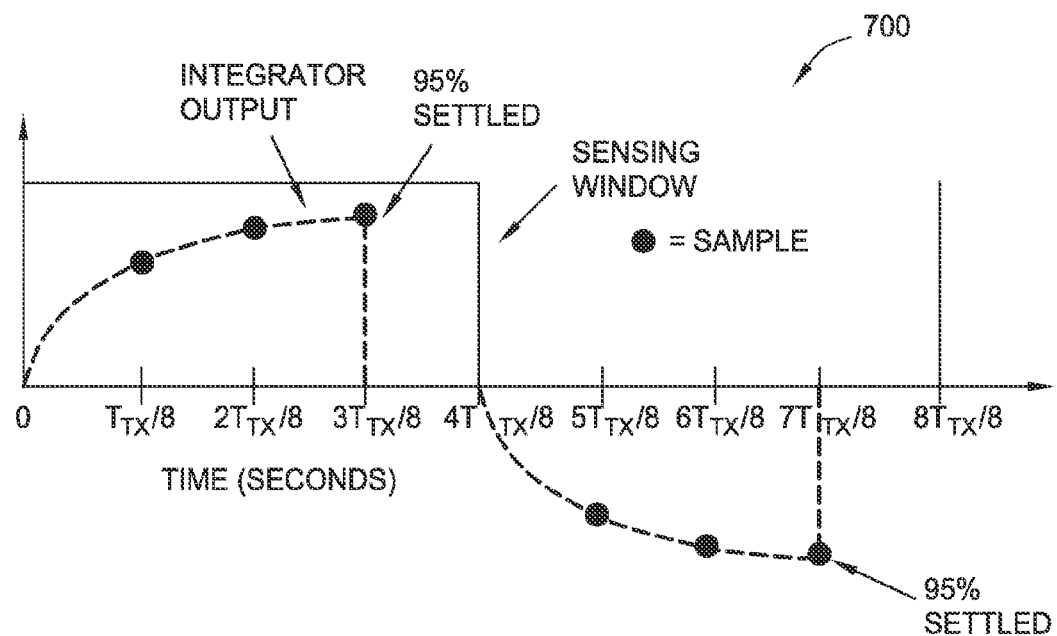
FIG. 7A is a graph that illustrates a situation where the 95%-settled point of a signal occurs at the $S_{NEG+}45°$ timing illustrated in FIG. 4.
Figure 7B:
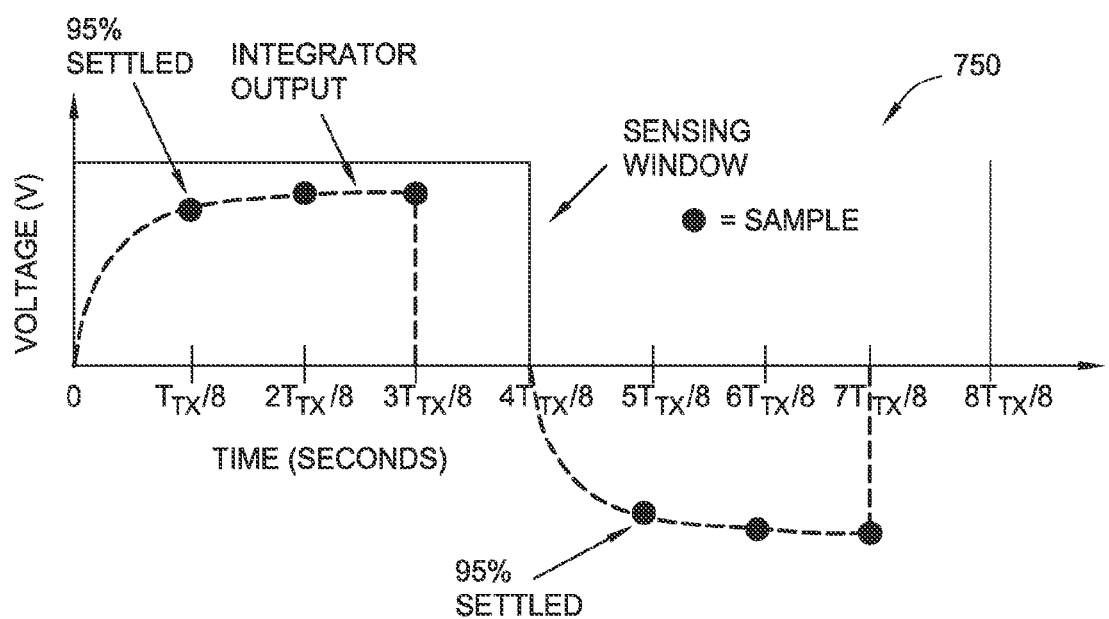
FIG. 7B is a graph that illustrates a situation where the 95%-settled point of a signal occurs at the $S_{NEG}$_45° timing illustrated in FIG. 4.

FIGS. 7A and 7B illustrate that the sensing frequency and thus the timings with which the switched-capacitor harmonic-reject mixer 300 operates can be varied. More specifically, the sensing frequency (and thus the timing of the switch activations, since those timings are tied to the sensing frequency) can be altered to control when the first sub-circuit 302, and thus the −45° timing, occurs. More specifically, the sensing frequency can be varied such that the first sampling—that is, the sampling for $S_{NEG-45°}$—occurs when the received signal is 95% settled, or such that the third sampling—that is, the sampling for $S_{NEG+45°}$—occurs when the received signal is 95% settled. These timings are described in more detail with respect to FIGS. 7A and 7B. Note that although the value of 95% is used, any other value may alternatively be used.

FIG. 7A is a graph 700 that illustrates a situation where the $S_{NEG+45°}$ timing occurs at the 95%-settled point. This situation means that the timings before the $S_{NEG+45°}$ timing occur before this 95%-settled point. Of course, the 95%-settled point occurs twice per sensing period—both when the sensing signal is high and when the sensing signal is low (assuming a square wave sensing signal), as shown. In more precise terms, in the timing scheme illustrated in FIG. 7A, the 95% settled voltage is sampled at time $3*T_{TX}/8$, and at $7T_{TX}/8$, where $T_{TX}$ is the sensing period (the period associated with the sensing frequency). Because the 95% settled voltage occurs roughly at $3*\tau$, where $\tau$ is the time constant of a sensor electrode driven for capacitive sensing, and because the 95% settled voltage is sampled at the $S_{NEG+45°}$ timing, which occurs at $3*T_{TX}/8$ (as well as $7*T_{TX}/8$), $\tau=T_{TX}/8$, and therefore the sensing period, $8*T_{TX}/8*\tau$. In other words, when switched-capacitor harmonic-reject mixer 300 is operated to sample the 95%-settled point at the $S_{NEG+45°}$ timing, the sensing frequency should be $8*\tau$, where $\tau$ is the time constant of a sensor electrode. In general, the time constant is equal to R*C for the sensor electrode.

FIG. 7B is a graph 750 that illustrates a situation where the 95%-settled point occurs at the $S_{NEG-45°}$ timing (rather than occurring at the $S_{NEG+45°}$ timing, as with graph 700). This situation means that the 95% settled voltage is sampled at $1*T_{TX}/8$ and $5*T_{TX}/8$, where, again, $T_{TX}$ is the sensing period. Because, again, the 95% settled voltage occurs at $3*\tau$, where $\tau$ is the time constant of a sensor electrode, and because the 95% settled voltage is sampled at the $S_{NEG-45°}$ timing, which occurs at $1*T_{TX}/8$ (as well as $5*T_{TX}/8$), $3*\tau=T_{TX}/8$, $\tau=T_{TX}/24$, and therefore the sensing period, $8*T_{TX}/8$, is $24*\tau$. In other words, when switched-capacitor harmonic-reject mixer 300 is operated to sample the 95%-settled point at the $S_{NEG-45°}$ timing, the sensing frequency should be $24*\tau$, where $\tau$ is the time constant of a sensor electrode.

Figure 8:
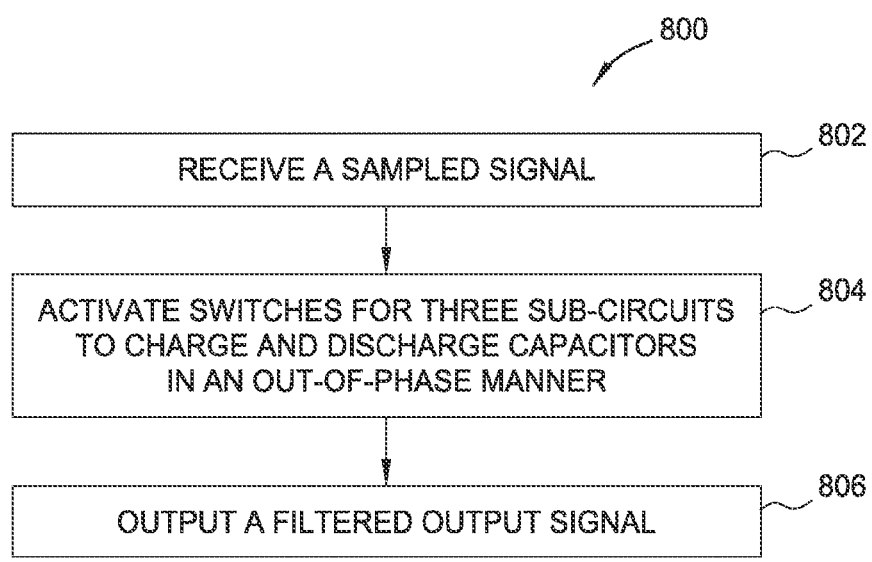
FIG. 8 is a flow diagram of method steps for filtering harmonics from a signal, according to an example.

FIG. 8 is a flow diagram of a method 800 for filtering harmonics from a signal, according to an example. Although the method 800 is described in conjunction with FIGS. 1-7B, persons skilled in the art will understand that any system configured to perform the method 800, in various alternative orders, falls within the scope of the present invention.

As shown, the method 800 begins at step 802, where a switched-capacitor harmonic-reject mixer 300 receives a sampled signal, such as a signal received from the front-end circuit 602 of FIG. 6. At step 804, the switched-capacitor harmonic-reject mixer 300 activates switches for three sub-circuits to charge and discharge capacitors in an out-of-phase manner to filter harmonics from the inputted signal. At step 806, the switched-capacitor harmonic-reject mixer 300 outputs the filtered signal.

Advantageously, the switched-capacitor harmonic-reject mixer 300 shown and described above reduces the sensitivity of a circuit to interference having frequency components at odd harmonics of a subject frequency. Further, the mixer 300 allows this functionality to be done with low power consumption and with a small footprint.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A discrete-time harmonic rejection mixer, comprising:
a switched-capacitor network having an input, an output, and first, second, and third switched capacitor sub-circuits, each of the first, second, and third switched capacitor sub-circuits including:
a first capacitor connected between a supply voltage and a first node;
a second capacitor connected between a second node and a third node;
a set of switches configured to switch connection of the first node between the input and the output, switch connection of the second node between the input and the supply voltage, and switch connection of the third node between the output and a ground voltage; and
a switch controller coupled to the switched-capacitor network, the switch controller configured to operate the set of switches in each of the first, second, and third switched capacitor sub-circuits by:
operating the set of switches in the first switched capacitor sub-circuit to charge and discharge the respective first and second capacitors therein according to a first charge timing that is phase-shifted in a first direction as compared with a second charge timing,
operating the set of switches in the second switched capacitor sub-circuit to charge and discharge the respective first and second capacitors therein according to the second charge timing,
operating the set of switches in the third switched capacitor sub-circuit to charge and discharge the respective first and second capacitors therein according to a third charge timing that is phase-shifted in a second direction as compared with the second charge timing, wherein capacitance values for the first and second capacitors of the first switched capacitor sub-circuit are approximately equal to capacitance values for the first and second capacitors of the third switched capacitor sub-circuit.

2. The discrete-time harmonic rejection mixer of claim 1, wherein:
the switch controller is further configured to operate the set of switches in each of the first, second, and third switched capacitor sub-circuits phase shifted by zero degrees to operate the switched-capacitor network as a demodulator.

3. The discrete-time harmonic rejection mixer of claim 1, wherein:
each of the first switched capacitor sub-circuit, the second switched capacitor sub-circuit, and the third switched capacitor sub-circuit comprises a demodulator circuit.

4. The discrete-time harmonic rejection mixer of claim 1, wherein:
the switched capacitor network is operable to receive an input signal at the input.

5. The discrete-time harmonic rejection mixer of claim 4, wherein:
the input signal comprises a sensing signal received from sensor electrodes for detecting presence of an input object in a sensing region.

6. The discrete-time harmonic rejection mixer of claim 4, wherein:

the switched-capacitor network rejects a third harmonic and a fifth harmonic from the input signal.

7. The discrete-time harmonic rejection mixer of claim 4, wherein:
the input signal is received from a resetting charge integrator.

8. The discrete-time harmonic rejection mixer of claim 1, wherein:
the first charge timing is phase shifted by approximately positive 45 degrees as compared to the second charge timing and the third charge timing is phase shifted by approximately negative 45 degrees as compared to the second charge timing.

9. The discrete-time harmonic rejection mixer of claim 1, wherein:
capacitance values for the first and second capacitors of the second switched capacitor sub-circuit are substantially equal to the capacitance values for the first and second capacitors of the first switched capacitor sub-circuit multiplied by a square root of two.

10. An input device, comprising:
a plurality of sensor electrodes; and
a discrete-time harmonic rejection mixer coupled to the plurality of sensor electrodes, the discrete-time harmonic rejection mixer comprising:
a switched-capacitor network having an input, an output, and first, second, and third switched capacitor sub-circuits, each of the first, second, and third switched capacitor sub-circuits including:
a first capacitor connected between a supply voltage and a first node;
a second capacitor connected between a second node and a third node;
a set of switches configured to switch connection of the first node between the input and the output, switch connection of the second node between the input and the supply voltage, and switch connection of the third node between the output and a ground voltage; and
a switch controller coupled to the switched-capacitor network, the switch controller configured to operate the set of switches in each of the first, second, and third switched capacitor sub-circuits by:
operating the set of switches in the first switched capacitor sub-circuit to charge and discharge the respective first and second capacitors therein according to a first charge timing that is phase-shifted in a first direction as compared with a second charge timing,
operating the set of switches in the second switched capacitor sub-circuit to charge and discharge the respective first and second capacitors therein according to the second charge timing,
operating the set of switches in the third switched capacitor sub-circuit to charge and discharge the respective first and second capacitors therein according to a third charge timing that is phase-shifted in a second direction as compared with the second charge timing, wherein capacitance values for first and second capacitors of the first switched capacitor sub-circuit are approximately equal to capacitance values for the first and second capacitors of the third switched capacitor sub-circuit.

11. The input device of claim 10, wherein:
the switch controller is further configured to operate the set of switches in each of the first, second, and third switched capacitor sub-circuits phase shifted by zero degrees to operate the switched-capacitor network as a demodulator.

12. The input device of claim 10, wherein:
each of the first switched capacitor sub-circuit, the second switched capacitor sub-circuit, and the third switched capacitor sub-circuit comprises a demodulator circuit.

13. The input device of claim 10, wherein:
the switched capacitor network is operable to receive an input signal at the input.

14. The input device of claim 13, wherein:
the input signal comprises a sensing signal received from the plurality of sensor electrodes for detecting presence of an input object in a sensing region.

15. The input device of claim 13, wherein:
the switched-capacitor network rejects a third harmonic and a fifth harmonic from the input signal.

16. The input device of claim 13, wherein:
the input signal is received from a resetting charge integrator coupled to the plurality of sensor electrodes.

17. The input device of claim 10, wherein:
the first charge timing is phase shifted by approximately positive 45 degrees as compared to the second charge timing and the third charge timing is phase shifted by approximately negative 45 degrees as compared to the second charge timing.

18. The input device of claim 10, wherein:
capacitance values for the first and second capacitors of the second switched capacitor sub-circuit are substantially equal to the capacitance values for the first and second capacitors of the first switched capacitor sub-circuit multiplied by a square root of two.

19. A method for rejecting harmonic components of a signal using a switched-capacitor network having an input, an output, and first, second, and third switched capacitor sub-circuits, each of the first, second, and third switched capacitor sub-circuits including a first capacitor connected between a supply voltage and a first node, a second capacitor connected between a second node and a third node, and a set of switches configured to switch connection of the first node between the input and the output, switch connection of the second node between the input and the supply voltage, and switch connection of the third node between the output and a ground voltage, the method comprising:
operating the set of switches in the first switched capacitor sub-circuit to charge and discharge the respective first and second capacitors therein according to a first charge timing that is phase-shifted in a first direction as compared with a second charge timing,
operating the set of switches in the second switched capacitor sub-circuit to charge and discharge the respective first and second capacitors therein according to the second charge timing,
operating the set of switches in the third switched capacitor sub-circuit to charge and discharge the respective first and second capacitors therein according to a third charge timing that is phase-shifted in a second direction as compared with the second charge timing,
wherein capacitance values for the first and second capacitors of the first switched capacitor sub-circuit are approximately equal to capacitance values for the first and second capacitors of the third switched capacitor sub-circuit.

20. The method of claim 19, further comprising:
  receiving an input signal from a plurality of sensor electrodes at the input.

\* \* \* \* \*